United States Patent [19]

Chen

[11] 4,411,058

[45] Oct. 25, 1983

[54] PROCESS FOR FABRICATING CMOS DEVICES WITH SELF-ALIGNED CHANNEL STOPS

[75] Inventor: John Y. Chen, Los Angeles, Calif.

[73] Assignee: Hughes Aircraft Company, El Segundo, Calif.

[21] Appl. No.: 297,903

[22] Filed: Aug. 31, 1981

[51] Int. Cl.[3] .......................................... H01L 21/265
[52] U.S. Cl. ..................................... 29/571; 29/576 B; 29/578; 148/187; 148/190
[58] Field of Search ....................... 29/571, 576 B, 578; 148/187, 1.5, 190

[56] References Cited

U.S. PATENT DOCUMENTS

| | | | |
|---|---|---|---|
| 3,892,609 | 7/1975 | Coppen | 148/187 X |
| 3,983,620 | 10/1976 | Spadea | 29/571 |
| 4,013,484 | 3/1977 | Boleky et al. | 148/187 X |
| 4,046,606 | 9/1977 | Lambert | 148/187 |
| 4,110,899 | 9/1978 | Nagasawa et al. | 29/571 |
| 4,224,733 | 9/1980 | Spadea | 29/571 |
| 4,268,321 | 5/1981 | Meguro | 148/187 X |
| 4,277,291 | 7/1981 | Cerofolini et al. | 148/187 X |
| 4,280,272 | 7/1981 | Egawa et al. | 148/187 X |
| 4,306,916 | 12/1981 | Wollesen et al. | 29/576 B |
| 4,315,781 | 2/1982 | Henderson | 148/187 X |

*Primary Examiner*—G. Ozaki
*Attorney, Agent, or Firm*—David W. Collins; Gerald B. Rosenberg; Anthony W. Karambelas

[57] ABSTRACT

An improved process is provided for fabricating CMOS (Complementary Metal Oxide Semiconductor) devices formed on a semiconductor substrate having n-channel and p-channel regions of n- and p-type conductivity, respectively. Conventional source, drain and gate portions are formed in the regions and electrical contacts are made thereto. The improvement comprises providing self-aligned channel stops between regions of the same conductivity and between regions of the opposite conductivity. The channel stops between regions of the opposite conductivity are mutually self-aligned. The self-alignment is achieved by use of a single mask, called a "complementary" mask. The process of the invention permits fabrication of submicrometer devices.

27 Claims, 7 Drawing Figures

PROCESS FOR FABRICATING CMOS DEVICES WITH SELF-ALIGNED CHANNEL STOPS

BACKGROUND OF THE INVENTION

1. Field of the Invention

The invention relates to a process for fabricating CMOS devices on a single semiconductor substrate, and, more particularly, to a process for providing CMOS devices with self-aligned channel stops for both n-channel and p-channel devices as well as mutual self-alignment between the two channel stops. Advantageously, the two different type channel stops are implanted using only one mask, called herein a "complementary" mask.

2. Description of the Prior Art

CMOS (Complementary Metal Oxide Semiconductor) devices provide an inherently low power static circuit technology which has the capability of providing lower power-delay product than a comparable design-rule NMOS technology. In the VLSI era, large random logic devices (such as microprocessors) are often power-limited; that is, the total power dissipation can limit the gate count of a chip and hence limit its scale of integration and ultimate performance.

In the prior art, CMOS devices formed on a bulk substrate of a given conductivity comprise both NMOS and PMOS devices in adjacent arrangement. Where the source and drain connections of one type of device are of the same conductivity as the substrate, then a well of the opposite conductivity is generally formed in the substrate surrounding the source and drain regions, to which electrical connections are made. For devices of conductivity opposite to that of the substrate, the source and drain regions are simply implanted into the substrate and electrical connections made thereto.

Such devices are well-known in the art and perform adequately at spacings on the order of a few micrometers. However, in scaling down to submicrometer dimensions, punch-through occurs between source and drain, even at low voltages, as the distance between them decreases. Further, due to the increasing proximity of NMOS and PMOS devices, latch-up problems easily occur due to the formation of parasitic bipolar transistors.

In an attempt to overcome some of these problems, wells are also provided for the second group of devices. A similar concept is disclosed in IEDM Digest, pp. 752–755 (1980). However, due to the lack of channel stop formation in the structure, there is still a problem of leakage between N and P devices, thereby causing latch-up, as well as leakage between N and N devices and between P and P devices.

SUMMARY OF THE INVENTION

In accordance with the invention, a process is provided for fabricating CMOS devices formed on a semiconductor substrate provided with regions of n- and p-type conductivity which includes forming source, drain and gate portions in the regions and making electrical connections to the portions. The process comprises forming self-aligned channel stops between regions of the same conductivity and between regions of the opposite conductivity.

The self-aligned channel stops, which are highly doped regions, are formed using one mask (called herein a "complementary" mask). This is accomplished by a process which includes:

(a) opening windows for both n- and p-channel devices in an oxide layer formed on the semiconductor substrate;

(b) forming the complementary mask to cover p-channel devices by a composite resist and implanting n-channel devices;

(c) evaporating a metal layer on both the composite resist and the n-channel devices;

(d) lifting off those portions of the metal layer covering the composite resist; and (e) implanting p-channel devices using the remaining portions of the metal layer as a mask.

The self-aligned channel stops produce high field threshold voltages for both n- and p-channel devices. Parasitic bipolar transistors are eliminated because heavily doped regions from the channel stop implant do not form the base of a bipolar transistor. The mutual self-alignment between the two channel stops provides high packing density because no separation is required between the channel stops for registration tolerance to prevent overlap between $p^+$ and $n^+$ channel stops. The overlap would otherwise cause compensation of $p^+$ and $n^+$ species, resulting in a lightly-doped region. Further, the device performance (punch-through voltage between the two channel stops) is not affected by misalignment. Finally, only one mask is needed to implant both p-type and n-type channel stops.

DETAILED DESCRIPTION OF THE INVENTION

Figure 1A:
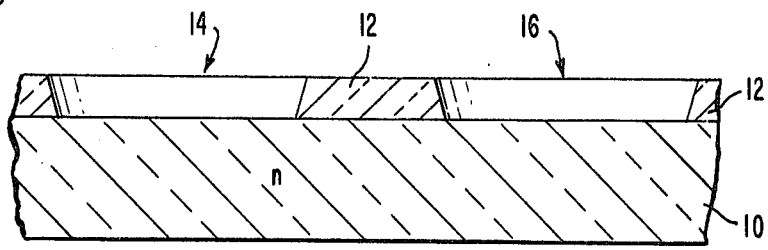
FIGS. 1a–d are cross-sectional views of a portion of a semiconductor substrate processed in accordance with the invention.

Referring now to the Drawing, FIG. 1a depicts a semiconductor substrate 10, preferably silicon, here lightly doped with n-type atoms, about $5 \times 10^{14}$ atoms/cm$^3$, over which has been formed a dielectric layer 12. Preferably, layer 12 is silicon dioxide, often referred to as the field oxide, and, in this process, is formed to a thickness of about 4,000 to 5,000 Å. While the silicon substrate shown here is doped with n-type material, it should be understood that p-type silicon may alternatively be employed as a substrate for fabricating devices in accordance with the invention.

Figure 1B:
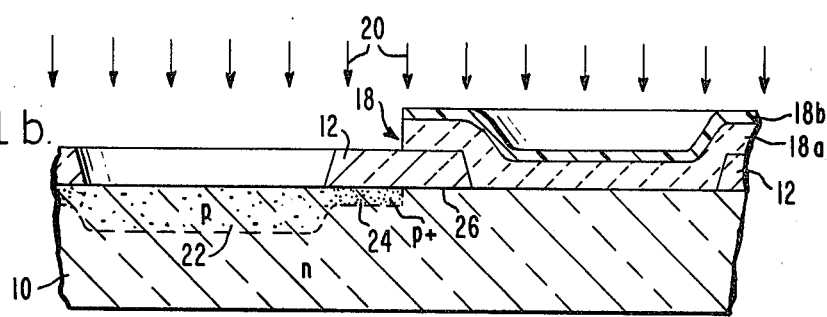

For fabricating NMOS and PMOS devices, a plurality of openings, one of which is shown at 14 (NMOS) and one of which is shown at 16 (PMOS), is formed in layer 12 by conventional masking and etching techniques to expose portions of the underlying substrate. These openings define the n-channel and p-channel regions, respectively, that will subsequently become the source, drain and channel regions of the NMOS and PMOS devices, respectively. As shown in FIG. 1b, a composite resist mask 18, called herein the "complementary" mask and described in greater detail below, is then formed over those openings which comprise the p-channel devices. P-type ions, such as boron, are then implanted, shown at 20, to form simultaneously a p-well 22 a p+ region (channel stop) 24 in the semiconductor substrate. The implantation is done under conditions such that the peak distribution of atoms lies in the silicon substrate just beneath the silicon/silicon dioxide interface 26 (i.e., within a few hundred Å thereof) in order to overcome processing variations in oxide formation. This ensures that the p-doping concentration in the channel stop region 24 is maximum near the surface, while the p-doping concentration in p-well 22 is maximum at about half the depth of the p-well. The position of the distribution peak near the interface for the channel stop region serves to reduce parasitic conduction between neighboring transistors. N-type ions, such as phosphorus, are then implanted into the p-well to counter-dope the surface region. The implantation energy is low enough such that the phosphorus atoms do not penetrate the field oxide. The channel stop region is therefore not affected by this phosphorus implant. This counter-doping process, which is preferred because of the control over threshold voltage it provides, is more fully described in Ser. No. 142,902, filed Apr. 23, 1980 issued Feb. 16, 1982 as U.S. Pat. No. 4,315,781, and thus does not form a part of this invention.

Simple experimentation is adequate for determining the particular conditions needed to establish the desired doping profile. For example, for a layer of silicon dioxide 4,000 Å thick, a deep boron implant at a dosage of $1 \times 10^{13}/cm^2$ at 120 keV and a shallow phosphorus implant at a dosage of $9 \times 10^{11}/cm^2$ at 200 keV is sufficient to form the desired doping profiles in both the p-well and the channel stop regions. In the p-well region, the peak distribution of implanted atoms under these conditions is about 0.4 $\mu m$ below the silicon surface.

Figure 1C:
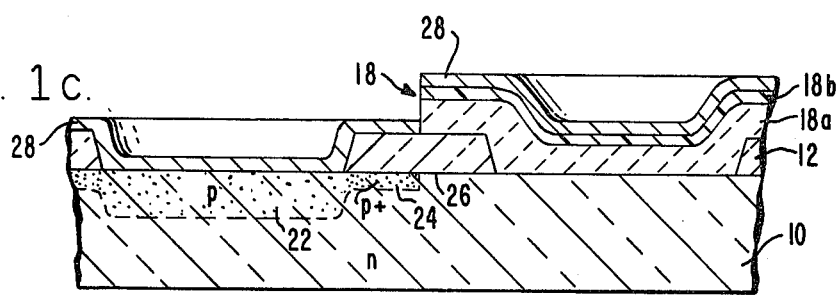

A metal layer 28 is then formed over the entire structure, such as by evaporation. The metal layer is thin enough to provide discontinuities between those regions covered with the composite resist and those regions not so covered, as shown in FIG. 1c.

At this point, it is appropriate to discuss the nature of the composite resist layer 18. One layer of photoresist is not sufficient to accomplish a successful lift-off technique for a number of reasons. First, as employed herein, the photoresist composite should be at least twice as thick as the metal layer 28 in order to have metal discontinuity at the resist edges during lift-off of the metal. The required minimum thickness of the metal layer is an inverse function of its density. For example, an aluminum metal layer is formed to a thickness of about 5,000 Å, while a gold metal layer is formed to a thickness of about 2,500 Å. The purpose of this metal layer in ion implantation is discussed below.

An additional problem with a single photoresist layer is that it will not give both the desired resolution and desired wall profile simultaneously. Too thick a single layer results in poor resolution. Yet, the composite resist layer is required to be thicker than that customarily employed in the art. Ideally, a steep sidewall or even slight undercut is required in order to obtain the desired metal lift-off. The desired geometry is realized by employing a composite resist comprising two or more layers. There are many ways of forming a composite resist useful in the practice of the invention. For example, a thick photoresist layer about 2 $\mu m$ thick or a polysilicon (polycrystalline silicon) layer 18a about 1 $\mu m$ thick is capped with a thin (about 0.5 to 1 $\mu m$) photoresist layer 18b. The thin photoresist layer provides the high resolution desired. The top resist layer is patterned and used as a mask, and the bottom layer is then over-developed (photoresist) or over-etched (polysilicon) slightly to obtain what is known in the art as the "mushroom" effect. Advantageously, polysilicon is employed as the bottom layer, since it is a better implant mask than photoresist. However, polysilicon does not dissolve during the lift-off process with the top photoresist layer, so it must be etched away, such as by a $CF_4$ plasma. In order to provide a stopping layer for plasma etching, a very thin oxide (not shown), about 200 Å, is typically grown (prior to the polysilicon deposition) to serve as a plasma etch stop and to protect the silicon substrate surface. This thin oxide is then stripped and regrown subsequently to form a gate oxide, as described below. Alternatively, a three-layer resist structure (not shown) may be employed as the composite resist 18. Typically, a thick photoresist layer about 2 $\mu m$ thick is formed on the substrate, followed by a thin metal layer, for example, about 1,000 Å of aluminum, silicon or germanium, capped with a thin photoresist layer about 0.5 $\mu m$ to 1 $\mu m$ thick. Such a structure allows for a high degree of control of wall profile.

Figure 1D:
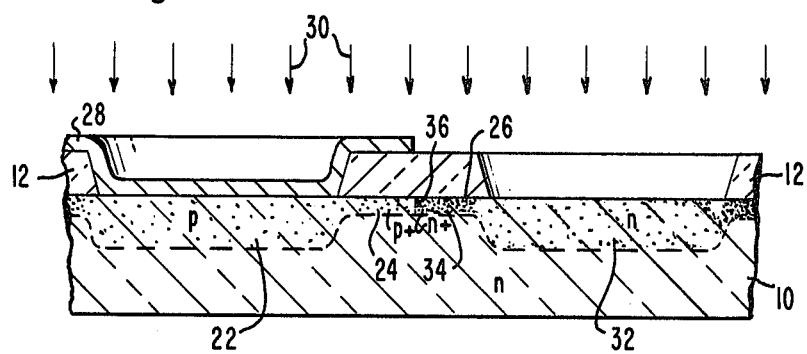

The composite resist 18 is removed by dissolving the resist, thus taking with it (lifting off) the over-lying metal layer 28, leaving the structure shown in FIG. 1d. N-type ions, such as phosphorus, are then implanted, shown at 30, to form simultaneously an n-well 32 and an n+ region (channel stop) 34. As with the implantation of p-type ions, the implantation is done under conditions such that the peak distribution of atoms lies in the substrate just beneath the substrate/field oxide interface 26. P-type ions, such as boron, are then implanted into the n-well to counter-dope the surface region, as described above for the p-well formation. The metal mask 28 over the n-channel regions protects those regions against implantation. Accordingly, the metal selected and its thickness are such as to effectively stop the ion implantation, employing the considerations described above. As can be seen, both p-channel and n-channel stops are mutually self-aligned at 36. Self-alignment between adjacent n- and n-channel devices and p- and p-channel devices is also achieved.

The substrate is then processed in accordance with prior art techniques for fabricating finished devices. For example, gate oxides about 400 Å thick are grown on the silicon substrate surface. Polysilicon gates (polysilicon highly doped to n+) are formed thereover employing photoresist for masking. Sources and drains (n+) for the n-channel devices and sources and drains (p+) for the p-channel devices are implanted, employing conventional CMOS process technology. Appropriate contact holes are formed by conventional masking and etching, and the entire surface is metallized. The final electrode pattern is formed by conventional processes.

Figure 2:
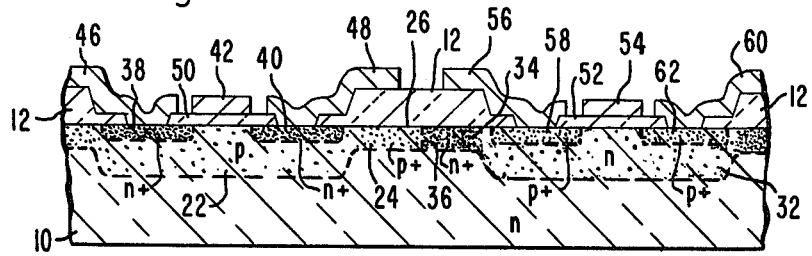
FIG. 2 is a cross-sectional view of a portion of a semiconductor substrate including both an NMOS device (left side) and a PMOS device (right side), produced by conventional polysilicon gate technology and employing the inventive process.

FIG. 2, in cross-section, shows source 38 and drain 40 regions, with polysilicon gate 42 over region 22, forming an NMOS device. Electrode 46 contacts the source region, while electrode 48 contacts the drain region. Gate oxide 50 separates polysilicon gate 42 from the semiconductor surface. Likewise, in a PMOS device, gate oxide 52 separates polysilicon gate 54, which is positioned over region 32, from the semiconductor surface. Electrode 56 contacts source region 58 and electrode 60 contacts drain region 62.

Other contacting schemes can, of course, be used. Exemplary of such contacting schemes is the refractory gate process, in which a refractory gate metal such as tungsten or molybdenum is employed. Other gate metals, such as aluminum and metal silicide, may alternatively be employed.

The process sequence of the invention thus comprises:

(a) open windows for both n- and p-channel devices (mask no. 1) in oxide layer on semiconductor substrate;
(b) form complementary mask to cover p-channel devices by composite resist 18 and implant ions to form n-channel devices (i.e., p-wells and p+ channel stops) (mask no. 2);
(c) evaporate metal layer 28 on both the composite resist and the n-channel devices;
(d) lift off those portions of the metal layer covering the composite resist; and
(e) implant ions to form p-channel devices (i.e., n-wells and n+ channel stops) using the remaining portions of the metal layer as a mask.

For exemplary purposes only, the remaining steps to fabricate a completed device (polysilicon gate) include:

(f) form gate oxide;
(g) deposit polysilicon and diffuse n-type (e.g., phosphorus) impurity atoms therein;
(h) define polysilicon gates for both n-channel devices and p-channel devices and implant p-type (e.g., boron) ions for all sources and drains (both n- and p-channel) (mask no. 3);
(i) define n+-regions for n-channel devices and heavily implant n-type (e.g., arsenic) ions for n-channel sources and drains by over-compensating previously implanted boron atoms (mask no. 4);
(j) define contact holes (mask no. 5) and form metallization pattern (mask no. 6).

The central aspect of the invention depends on the success of the metal lift-off which is performed after the resist has been used as a mask during ion implantation. Metal lift-off can be a problem because it is difficult to maintain a resist profile suitable for the metal lift-off after ion implantation (e.g., 5,000 Å of Al or 2,500 Å of Au). Accordingly, the composite resist layer described above is employed to overcome this problem.

To compare the metal lift-off capabilities of a composite resist and a conventional monolithic resist, a composite resist layer comprising 1 μm of polysilicon and 1 μm of Shipley AZ photoresist was deposited on a silicon substrate, employing 200 Å of $SiO_2$ as a plasma etch stop. A single layer of 2 μm of AZ photoresist was also deposited on a silicon substrate. A 5,000 Å layer of aluminum was deposited over each resist layer. The aluminum was successfully lifted off the composite resist, but not off the monolithic resist.

The process disclosed herein provides a self-aligned n+ channel stop between n- and n-channel devices and a self-aligned p+ channel stop between p- and p-channel devices. The process also provides mutual self-alignment between these two channel stops.

Since the composite resist layer does not require thick resist to achieve good lift-off, the process can be employed in submicrometer device fabrication.

While ion-implantation of the n-channel device has been described as preceeding ion-implantation of the p-channel device, the sequence of ion implantations may be reversed, if desired. Further, this invention may also be applied to the fabrication of CMOS devices on insulating substrates such as sapphire (CMOS/SOS). In such devices, the n- and p-islands can be implanted by using the complementary mask disclosed herein.

EXAMPLES

An array of n- and p-channel devices (MOSFETs) was fabricated, employing the procedures described above. The thickness of the field oxide 12 was 4,000 Å, while that of the gate oxide 50, 52 was about 400 Å. Boron was implanted deep to define p-wells 22 and p+ channel stops 24 at a dosage of $1 \times 10^{13}/cm^2$ at 120 keV. Phosphorus was then implanted shallow to counter-dope the p-well at a dosage of $9 \times 10^{11}/cm^2$ at 200 keV in preparation for the formation of n-channel devices. Phosphorus was also implanted deep to define n-wells 32 and n+ channel stops 34 at a dosage of $1.5 \times 10^{13}/cm^2$ at 300 keV. Boron was then implanted shallow to counter-dope the n-well at a dosage of $7 \times 10^{12}/cm^2$ at 50 keV in preparation for the formation of p-channel devices. The complementary mask comprised a 200 Å $SiO_2$ plasma etch stop, a 1 μm thick polysilicon layer and a 1 μm thick Shipley AZ photoresist layer, over which was deposited 6,000 Å of Al. The source 58 and drain 62 regions of the PMOS devices were formed by implanting boron at a dosage of $5 \times 10^{14}/cm^2$ at 25 keV; the source 38 and drain 40 regions of the NMOS devices were likewise implanted at the same time. The source and drain regions of the NMOS devices were then implanted with arsenic at a dosage of $1.5 \times 10^{15}/cm^2$ at 150 keV, to over-compensate for the previous p-doping. The gate contacts 42, 54 were polysilicon, diffused with phosphorus. The source and drain contacts 46, 48, 56, 60 comprised 4,000 Å of a bilayer metal contact further comprised of a thin ohmic contact layer of WTi (90%:10% by wt.) underlying a relatively thicker conduction layer of aluminum.

Figure 3A:
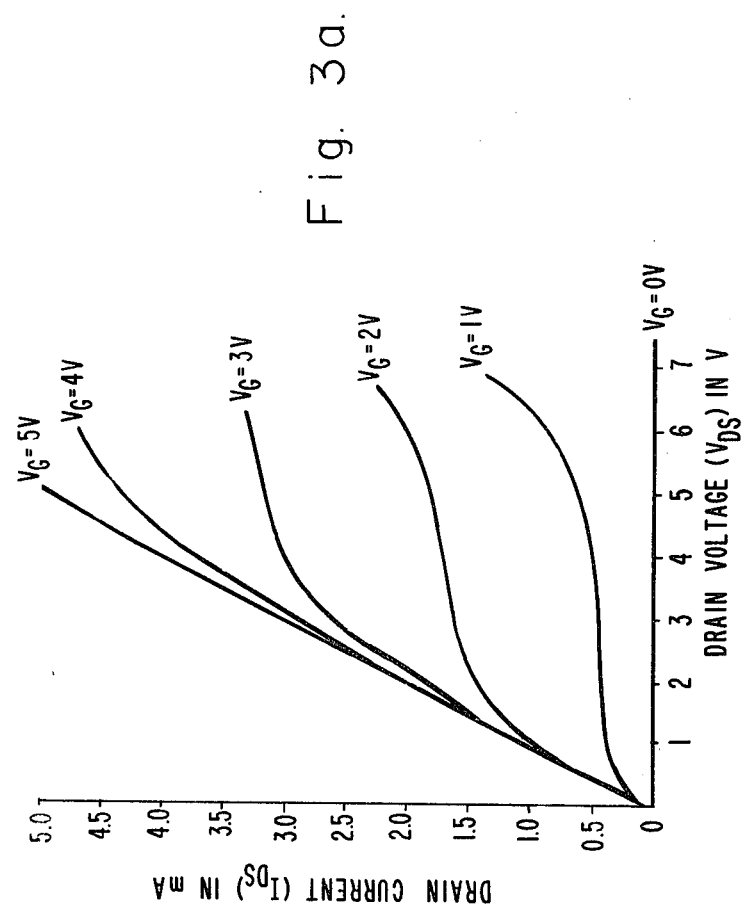
FIGS. 3a and 3b depict the I–V (current-voltage) characteristics of n-channel and p-channel devices fabricated in accordance with the invention.
Figure 3B:
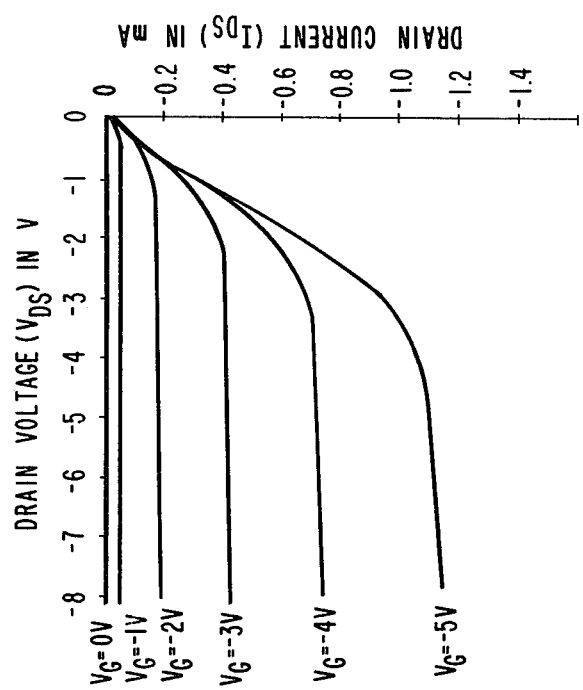

FIGS. 3a and 3b depicts the I-V characteristics of the 1 μm n- and p-channel MOSFET, respectively, at the gate voltages ($V_G$) given. Low threshold voltages ($V_t = 300$ mV and $-300$ mV, respectively) and high punch-through voltages ($V_{pt} = 8$ V and $-11$ V, respectively) for the n- and p-devices (active devices) were obtained and indicate the suitability of the process for CMOS VLSI. Desirably high threshold voltages of 14 V and $-32$ V were also obtained for the n- and p-channel field transistors (parasitic transistors).

The process disclosed herein was also employed to fabricate CMOS/SOS devices (using similar process parameters), including n-channel and p-channel MOSFETs, a series of CMOS/SOS inverters and a 31-stage CMOS/SOS ring oscillator, all on the same chip. The MOSFETs and inverters functioned correctly. The ring oscillator operated well at a speed and power of 148 ps and 70 mW for $V_{DD} = 12$ V and 2 ns and 0.5 mW for $V_{DD} = 3$ V.

What is claimed is:

1. A process for fabricating CMOS devices formed on a semiconductor substrate provided with n-channel and p-channel regions of n- and p-type conductivity, respectively, which includes forming source, drain and gate portions in said regions and making electrical contacts to said portions, wherein the improvement comprises forming self-aligned channel stops between regions of the same conductivity and between regions of the opposite conductivity by (a) forming a mask overlying and aligned with a number of said regions;
(b) implanting a number of first channel stops and well regions of one conductivity type;
(c) forming a layer overlying said regions;

(d) removing said mask and the corresponding portion of said layer, so as to leave the remaining portion of said layer overlying and automatically aligned with a number of said regions; and (e) implanting a number of second channel stops and well regions of the opposite conductivity type.

2. The process of claim 1 in which the channel stops between regions of the opposite conductivity are mutually self-aligned.

3. A process for fabricating CMOS devices formed on a semiconductor substrate with n-channel and p-channel regions of the n- and p-type conductivity, respectively, which includes forming source, drain and gate portions in said regions and making electrical contacts to said portions, wherein the improvement comprises forming self-aligned channel stops between regions of the same conductivity and between regions of the opposite conductivity by a process which includes:

(a) opening windows for both n- and p-channel regions in an oxide layer formed on the semiconductor substrate so as to expose n- and p-channel regions;

(b) forming a complementary mask to cover p-channel regions and channel stops by a composite resist mask and implanting ions to form n-channel regions;

(c) evaporating a metal layer on both the composite resist mask and the n-channel regions;

(d) lifting off those portions of the metal layer covering the composite resist mask; and (e) implanting ions to form p-channel regions and channel stops using the remaining portions of the metal layer as a mask.

4. The process of claim 3 in which the complementary resist mask comprises at least two layers.

5. The process of claim 4 in which the complementary resist mask is at least about twice as thick as the metal layer.

6. The process of claim 5 in which the complementary resist mask comprises a thick layer of photoresist about 2 μm thick formed on the substrate and a thin layer of photoresist about 0.5 to 1 μm thick formed on the thick photoresist layer.

7. The process of claim 5 in which the complementary resist mask comprises a thick layer of polysilicon about 1 μm thick and a thin layer of photoresist about 0.5 to 1 μm thick formed thereon.

8. The process of claim 5 in which the complementary resist mask comprises a thick layer of photoresist about 2 μm thick formed on the substrate, a thin metal layer about 1,000 Å thick formed on the thick photoresist layer and a thin photoresist layer about 0.5 to 1 μm formed on the metal layer.

9. The process of claim 3 in which the semiconductor substrate comprises silicon and the oxide layer comprises silicon dioxide.

10. The process of claim 9 in which boron atoms are implanted in the substrate to form p-wells and p+-channel stops and phosphorus atoms are implanted in the p-wells to form n-channel devices.

11. The process of claim 9 in which phosphorus atoms are implanted in the substrate to form n-wells and n+-channel stops and boron atoms are implanted in the n-wells to form p-channel devices.

12. The process of claim 3 in which the ions are implanted under conditions such that the peak distribution of atoms lies in the substrate just beneath the oxide layer.

13. The process of claim 3 in which the metal layer is formed to a thickness that is an inverse function of its density.

14. The process of claim 13 in which the metal layer comprises about 5,000 Å of aluminum or about 2,500 Å of gold.

15. A process for fabricating CMOS devices on a semiconductor substrate which includes:

(a) forming a field oxide on the substrate;

(b) opening windows in the field oxide for subsequent fabrication of both n- and p-channel devices;

(c) forming a composite resist mask over the p-channel windows;

(d) implanting ions to form p-wells and p+ channel stops;

(e) evaporating a metal layer over both the n-channel windows and the composite resist mask covering p-channel windows;

(f) removing the metal layer over the composite resist mask by lift-off; and (g) implanting ions to form n-wells and n+ channel stops.

16. The process of claim 15 in which the composite resist mask comprises at least two layers.

17. The process of claim 16 in which the composite resist mask is at least about twice as thick as the metal layer.

18. The process of claim 17 in which the composite resist mask comprises a thick layer of photoresist about 2 μm thick formed on the substrate and a thin layer of photoresist about 0.5 to 1 μm thick formed on the thick photoresist layer.

19. The process of claim 17 in which the composite resist mask comprises a thick layer of polysilicon about 1 μm thick and a thin layer of photoresist about 0.5 to 1 μm thick formed thereon.

20. The process of claim 17 in which the composite resist mask comprises a thick layer of photoresist about 2 μm thick formed on the substrate, a thin metal layer about 1,000 Å thick formed on the thick photoresist layer and a thin photoresist layer about 0.5 to 1 μm formed on the metal layer.

21. The process of claim 15 in which the semiconductor substrate comprises silicon and the field oxide comprises silicon dioxide.

22. The process of claim 21 in which boron atoms are implanted in the substrate to form p-wells and p+-channel stops and phosphorus atoms are implanted in the p-wells to form n-channel devices.

23. The process of claim 21 in which phosphorus atoms are implanted in the substrate to form n-wells and n+-channel stops and boron atoms are implanted in the n-wells to form p-channel devices.

24. The process of claim 15 in which the ions are implanted under conditions such that the peak distribution of atoms lies in the substrate just beneath the substrate/field oxide interface.

25. The process of claim 15 in which the metal layer is formed to a thickness that is an inverse function of its density.

26. The process of claim 25 in which the metal layer comprises about 5,000 Å of aluminum or about 2,500 Å of gold.

27. The process of claim 15 further including (h) removing the metal layer over the n-channel windows;

(i) forming a gate oxide in the n-channel and p-channel windows;
(j) depositing polysilicon and diffusing n-type atoms therein;
(k) defining polysilicon gates for both n-channel devices and p-channel devices and implanting p-type ions to form all source and drain regions;
(l) defining n+-regions for n-channel devices and implanting n-type ions to form source and drain regions for n-channel devices by over-compensating the previously implanted p-type atoms;
(m) forming contact holes; and
(n) forming a desired metallization pattern.

* * * * *